United States Patent
Wimpenny

(10) Patent No.: US 9,634,612 B2
(45) Date of Patent: Apr. 25, 2017

(54) EFFICIENCY FOR LINEAR AMPLIFIER OF ENVELOPE TRACKING MODULATOR

(71) Applicant: NUJIRA LIMITED, Cambourne, Cambridge Cambridgeshire (GB)

(72) Inventor: Gerard Wimpenny, Cambridgeshire (GB)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/764,806

(22) PCT Filed: Jan. 31, 2014

(86) PCT No.: PCT/EP2014/051967
§ 371 (c)(1),
(2) Date: Jul. 30, 2015

(87) PCT Pub. No.: WO2014/118347
PCT Pub. Date: Aug. 7, 2014

(65) Prior Publication Data
US 2016/0006396 A1    Jan. 7, 2016

(30) Foreign Application Priority Data
Feb. 1, 2013 (GB) .................................. 1301852.8

(51) Int. Cl.
*H03G 3/20* (2006.01)
*H03F 1/02* (2006.01)
(Continued)

(52) U.S. Cl.
CPC ......... *H03F 1/0211* (2013.01); *H03F 1/0227* (2013.01); *H03F 3/19* (2013.01);
(Continued)

(58) Field of Classification Search
CPC ........ H03F 1/0211; H03F 1/0227; H03F 3/19; H03F 3/211; H03F 3/217;
(Continued)

(56) References Cited

U.S. PATENT DOCUMENTS 6,175,273 B1 * 1/2001 Sigmon ................. H03F 1/0222
330/10
6,590,940 B1    7/2003 Camp, Jr. et al.
(Continued)

OTHER PUBLICATIONS

Hsia et al.,"Digitally Assisted Dual-Switch High-Efficiency Envelope Amplifier for Envelope-Tracking Base-Station Power Amplifiers", IEEE Transactions on Microwave Theory and Techniques, vol. 59, No. 11, Nov. 2011, pp. 2943-2952.*
(Continued)

*Primary Examiner* — Steven J Mottola
*Assistant Examiner* — Hafizur Rahman

(57) ABSTRACT

There is disclosed an envelope tracking power supply arranged to generate a modulated supply voltage in dependence on a reference signal, comprising a first path for tracking low frequency variations in the reference signal and a second path for tracking high frequency variations in the reference signal, the second path including a linear amplifier, wherein the output of the linear amplifier comprises a current source and a current sink connected to the high frequency output, there further being provided a DC offset current at the high frequency output.

18 Claims, 9 Drawing Sheets

(51) Int. Cl.
H03F 3/19 (2006.01)
H03F 3/21 (2006.01)
H03F 3/217 (2006.01)
H04W 52/02 (2009.01)

(52) U.S. Cl.
CPC ............. *H03F 3/211* (2013.01); *H03F 3/217* (2013.01); *H04W 52/0251* (2013.01); *H03F 2200/102* (2013.01); *H03F 2200/135* (2013.01); *H03F 2200/451* (2013.01); *H03F 2203/21106* (2013.01); *Y02B 60/50* (2013.01)

(58) Field of Classification Search
CPC ......... H03F 2200/102; H03F 2200/135; H03F 2200/451; H03F 2203/21106; H04W 52/0251; Y02B 60/50
USPC ......... 330/10, 126, 136, 149, 257, 288, 297; 327/350, 355; 332/145; 375/297; 455/127.1
See application file for complete search history.

(56) References Cited

U.S. PATENT DOCUMENTS 8,854,139 B2* 10/2014 Fagg ................. H03F 1/025
                                           330/288
2007/0052477 A1 3/2007 Festoe et al.
2009/0289720 A1 11/2009 Takinami et al.
2010/0311365 A1 12/2010 Vinayak et al.
2011/0089990 A1 4/2011 Wimpenny
2012/0214431 A1 8/2012 Kanno et al.

OTHER PUBLICATIONS

Hsia C., et al., "Digitally Assisted Dual-Switch High-Efficiency Envelope Amplifier for Envelope-Tracking Base-Station Power Amplifiers", IEEE Transactions on Microwave Theory and Techniques, IEEE Service Center, Piscataway, NJ, US, vol. 59, No. 11, Nov. 1, 2011 (Nov. 1, 2011), pp. 2943-2952, XP011389134, ISSN: 0018-9480, DOI: 10.1109/TMTT.2011.2166084.

Miaja P.F., et al., "A linear assisted DC/DC converter for Envelope Tracking and Envelope Elimination and Restoration applications", Energy Conversion Congress and Exposition (ECCE), 2010 IEEE, IEEE, Piscataway, NJ, USA, Sep. 12, 2010 (Sep. 12, 2010), pp. 3825-3832, XP031786984, ISBN: 978-1-4244-5286-6.

Stauth, J.T., et al., "Optimum Bias Calculation for Parallel Hybrid Switching-Linear Regulators", Applied Power Electronics Conference, APEC 2007—Twenty Second Annual IEEE, IEEE, PI, Feb. 1, 2007 (Feb. 1, 2007), pp. 569-574, XP031085267.

International Search Report and Written Opinion—PCT/EP2014/051967—ISA/EPO—Mar. 19, 2014.

* cited by examiner

EFFICIENCY FOR LINEAR AMPLIFIER OF ENVELOPE TRACKING MODULATOR

BACKGROUND TO THE INVENTION

Field of the Invention

The invention relates to envelope tracking modulated power supplies suitable for radio frequency power amplifier applications. The invention is particularly concerned with such power supplies in which a reference signal is used as an input to a low frequency path and a high frequency path, and in which each path generates separate outputs which are combined to form a supply voltage.

Description of the Related Art

Envelope tracking power supplies for radio frequency power amplifiers are well-known in the art. Typically a reference signal is generated based on an envelope of an input signal to be amplified. An envelope tracking power supply generates a supply voltage for the power amplifier which tracks the reference signal.

FIG. 1 shows a prior art envelope tracking (ET) modulator architecture in which a frequency splitter 12 is used to divide an incoming envelope reference signal on line 10 into a high frequency (HF) path signal on line 14 and a low frequency (LF) path signal on line 16. The frequency splitter 12 may include a low pass filter 18 in the low frequency path and a high pass filter 20 in the high frequency path. The signal in the LF path on line 16 is amplified by an efficient switched mode amplifier 22, and the signal in the HF path on line 14 is amplified by a wideband linear amplifier 24. A frequency selective combiner 26 is used to combine the signals in the LF and HF paths after amplification. In FIG. 1 the combiner 26 is illustrated as including a low frequency combining element (and high frequency blocking element) 28 in the low frequency path, and a high frequency combining element (and low frequency blocking element) 30 in the high frequency path. A combined signal from the combiner 26 on line 32 provides a feed to a load 34 which for the purposes of example is illustrated as a resistor. In a typical application the load is a power amplifier (PA), and the reference signal is derived from an input signal to be amplified by the power amplifier.

An example of a power amplifier system incorporating a supply architecture such as illustrated in FIG. 1 can be found in "Band Separation and Efficiency Optimisation in Linear-Assisted Switching Power Amplifiers", Yousefzadeh et al, [IEEE Power Electronics Specialists Conference 2006].

FIG. 2 shows an alternative prior art arrangement in which the frequency selective combiner 26 is an inductor-capacitor (LC) combiner. The low frequency combining element is an inductor 28a, and the high frequency combining element is a capacitor 30a. In this arrangement a feedback path 36 takes a signal from the combiner (or modulator) output on line 32, to the input of the linear amplifier 24. The signal on the feedback path 36 is subtracted from the signal in the high frequency path on line 14 by subtractor 38, to provide an input to the linear amplifier 24. The inclusion of the feedback path 36 achieves improved tracking accuracy compared to the arrangement of FIG. 1.

An example of a power amplifier system incorporating a supply architecture such as illustrated in FIG. 2 can be found in "Efficiency Optimisation in Linear-Assisted Switching Power Converters for Envelope Tracking in RF Power Amplifiers", Yousefzadeh et al, [IEEE Symposium on Circuits and Systems 2005].

It is an aim of the invention to provide an envelope tracking modulated power supply which offers improvements over the prior art, such as the arrangements of FIGS. 1 and 2.

SUMMARY OF THE INVENTION

The invention provides an envelope tracking power supply arranged to generate a modulated supply voltage in dependence on a reference signal, comprising a first path for tracking low frequency variations in the reference signal and a second path for tracking high frequency variations in the reference signal, the second path including a linear amplifier, wherein the output stage of the linear amplifier comprises a current source and a current sink connected to the high frequency output, there further being provided a DC offset current at the high frequency output.

The DC offset current may be chosen to minimise the power dissipated in the output stage of the linear amplifier.

The DC offset current may be derived from a further voltage supply which is lower than the output stage voltage supply.

The DC offset current may be provided via an inductor connected between the further power supply and the high frequency output.

The envelope tracking power supply may further comprise sensing the power difference in an output, and integrating the sensed power difference to control a switch mode converter to generate a second supply voltage to generate the DC offset current. Sensing the power difference may comprise measuring a supply voltage for generating the DC offset current, the output voltage, the source current and the sink current.

A target DC offset current may be determined in dependence on the difference between the input voltage waveform and the halved sum of the maximum and minimum voltage levels of the input waveform voltage. An error between the target DC offset current and a measured DC offset current may integrated and used to control a switch mode converter to generate a second supply voltage to generate the DC offset current.

An RF amplifier may include an envelope tracking power supply.

A mobile device for a mobile communication system may include an envelope tracking power supply.

An infrastructure element for a mobile communications system may include an envelope tracking power supply.

The invention further provides a method for an envelope tracking power supply arranged to generate a modulated supply voltage in dependence on a reference signal, comprising providing a first path for tracking low frequency variations in the reference signal and providing a second path for tracking high frequency variations in the reference signal, the second path including a linear amplifier, wherein the output stage of the linear amplifier comprises a current source and a current sink connected to the high frequency output, the method further comprising providing a DC offset current at the high frequency output.

BRIEF DESCRIPTION OF THE FIGURES

The invention is now described by way of example with reference to the accompanying Figures, in which.

DESCRIPTION OF THE PREFERRED EMBODIMENTS

In the following description the invention is described with reference to exemplary embodiments and implementations. The invention is not limited to the specific details of any arrangements as set out, which are provided for the purposes of understanding the invention.

Embodiments of the invention may apply to different feedback architectures for the linear amplifier in the high frequency path. The invention and its embodiments are not limited to a particular feedback arrangement in the high frequency path. For example in the foregoing illustration of FIG. 2 an arrangement is illustrated in which the linear amplifier receives a feedback from the output of the combiner. The present invention may also apply, for example, to an arrangement in which the linear amplifier receives a feedback from the output of the linear amplifier at the input to the combiner, and in which the path containing the linear amplifier does not include a high frequency filter such as filter 20 in FIG. 2, the linear amplifier path receiving the full-spectrum reference signal.

Figure 2:
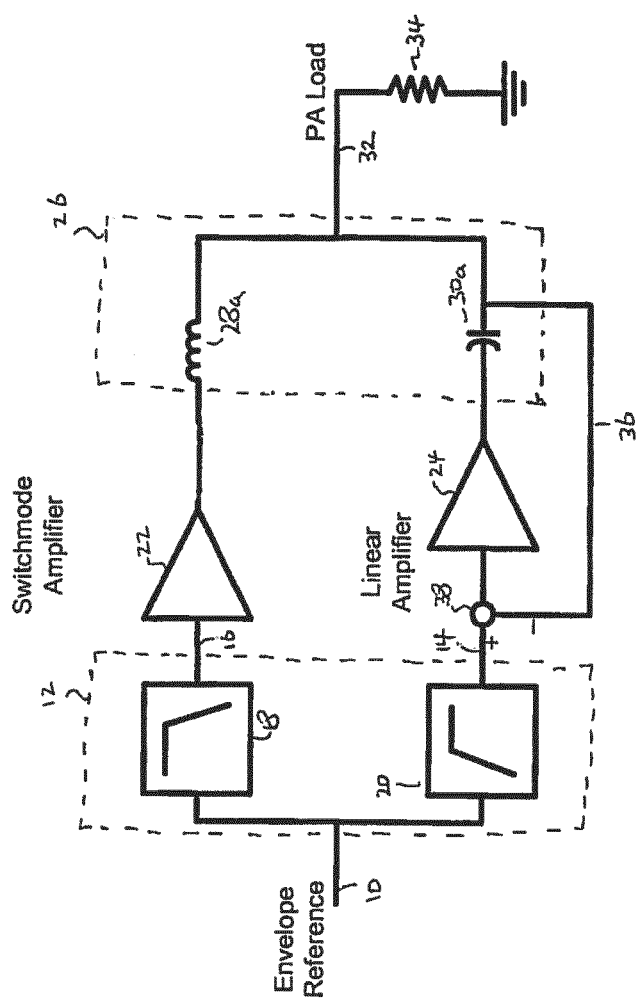
FIG. 2 illustrates a prior art envelope tracking modulated supply incorporating feedback in the high frequency path.

In general in a hybrid envelope tracking modulator (i.e. an architecture using a switched mode amplifier and a linear amplifier) as illustrated in FIG. 2, a significant proportion of the total modulator power dissipation occurs in the output stage of the linear amplifier.

Figure 3:
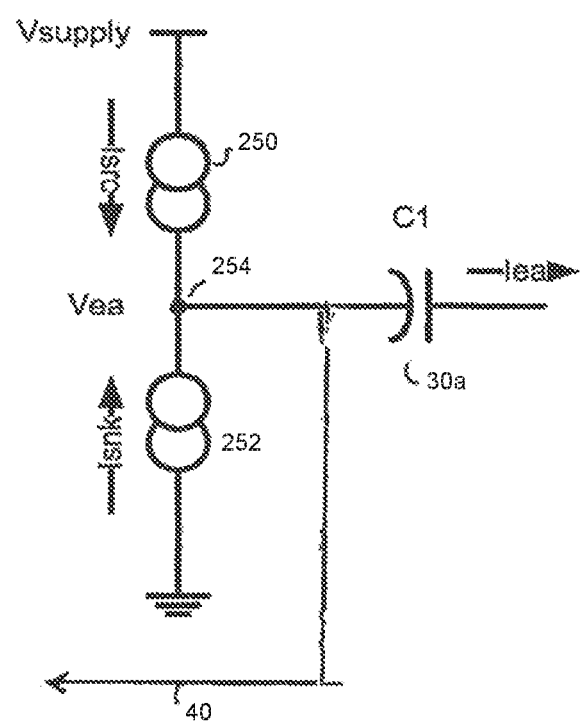
FIG. 3 illustrates a modified implementation an output of a linear amplifier in accordance with the arrangement of FIG. 1 or FIG. 2.

This can be understood with reference to FIG. 3, which illustrates an exemplary implementation of the linear amplifier 24 Class B output stage. As illustrated, a current source 250 is connected between a supply voltage $V_{SUPPLY}$ and a common node 254, and a current sink 252 is connected between the common node 254 and electrical ground $V_{GND}$. An instantaneous source current $I_{SRC}$ flows in the current source element 250, and an instantaneous current $I_{SNK}$ flows in the current sink element 252. At any given instant current flows in either the source device 250 or the sink device 252, and the current in the inactive device is zero. An output voltage $V_{EA}$ is formed at node 254. The combiner capacitor 30a of FIG. 2 is illustrated as connected between the node 254 and the output of the combiner. A current $I_{EA}$ flows in the combiner capacitor 30a.

For the purposes of example, the arrangement of FIG. 3 shows a feedback path 40 which represents a feedback from the output of the linear amplifier, before the combiner, to the input of the linear amplifier. The feedback is not described in more detail herein because it does not form part of the present invention. The current flow in the feedback path is assumed to be sufficiently low to be ignored.

No DC current can flow through the combiner capacitor 30a. Hence in the prior art arrangement of FIG. 3 the value of the average source current $I_{SRC}$ from current source 250 must be equal to the value of the average sink current $I_{SNK}$ from current sink 252.

In general the required modulator output voltage provided by the linear amplifier 24 may typically exhibit significant asymmetry, and this in turn results in asymmetry of the output current $I_{EA}$ of the linear amplifier 24.

Figure 4A:
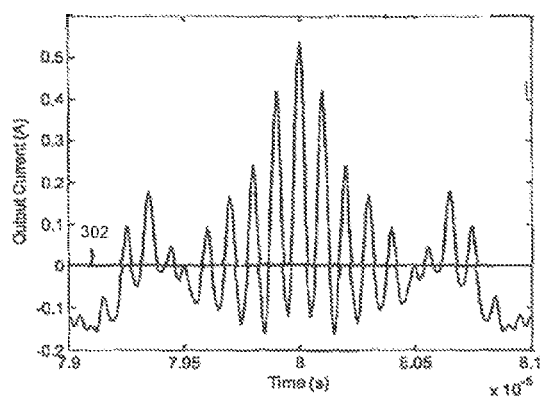
FIGS. 4(a) to 4(c) illustrate current flow in the arrangement of FIG. 3.

This is illustrated by the waveform of FIG. 4(a) which shows a plot of output current $I_{EA}$ against time. The current above the zero level 302 represents output positive currents which flow in the source transistor 250, and the current below the zero level 302 represents the output negative currents which flow in the sink transistor 252. The combined source and sink currents represent the output current $I_{EA}$.

Figure 4B:
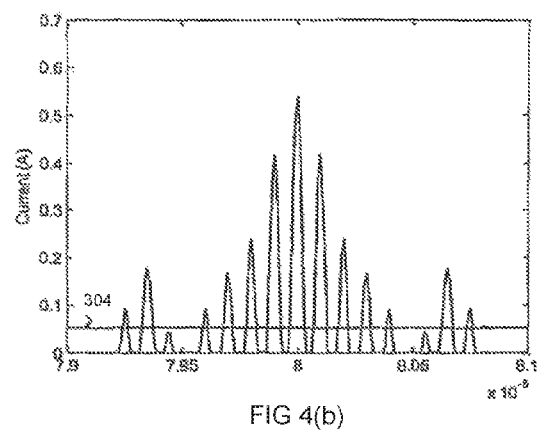
Figure 4C:
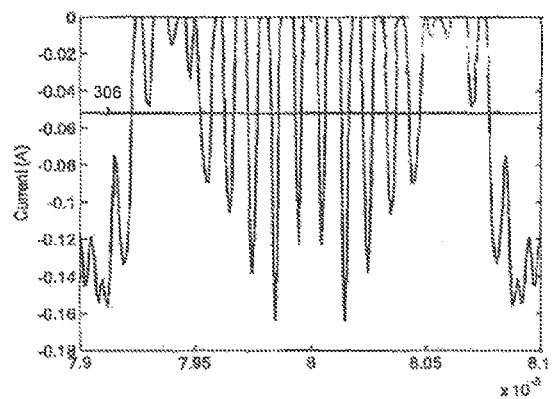

The values of each of the average source $I_{SRC}$ and sink $I_{SNK}$ currents are equal as shown in FIGS. 4(b) and 4(c), which shows plots of the source and sink currents against time.

The line 304 in FIG. 4(b) shows the average current in source device 250 and the line 306 in FIG. 4(c) shows the average current in the sink device 252. The average current in source device 250 is equal to the average current in sink device 252.

However in the example as shown the power dissipated in the upper device (the current source 250) is much greater than the power dissipated in the lower device (current sink 252). This disparity in power dissipation is due to the waveform asymmetry and results in much higher voltages across the upper (source) device.

It can thus be seen that the necessity for the average sink and source currents to be equal for the output topology of FIG. 3 is disadvantageous.

In accordance with a preferred embodiment of the invention, an extra voltage supply is used to add a DC (or low frequency) offset current via an inductor to the output node of the linear amplifier 24. There is thus no longer a requirement for the average source and sink currents to be equal.

Figure 5:
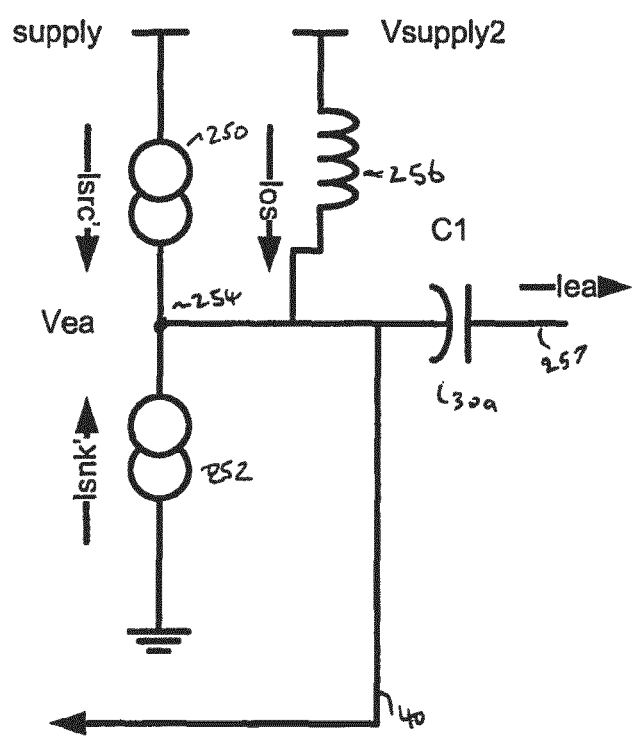
FIG. 5 illustrates the implementation of the output of a linear amplifier in the arrangement of FIG. 1 or FIG. 2 in accordance with an embodiment of the present invention.

FIG. 5 shows such a modified topology. The arrangement of FIG. 3 is modified such that an inductor 256 is included between a second supply voltage $V_{SUPPLY2}$ and the node 254. The inductor 256 provides an offset current $I_{OS}$, which flows in the inductor 256 from the voltage supply $V_{SUPPLY2}$.

The instantaneous current in the current source 250 is modified to $I_{SRC'}$ and the instantaneous current in the current sink 252 is $I_{SNK'}$. The output current $I_{EA}$ flows in the output capacitor 30a, and the output voltage $V_{EA}$ is formed at the node 254.

Figure 6A:
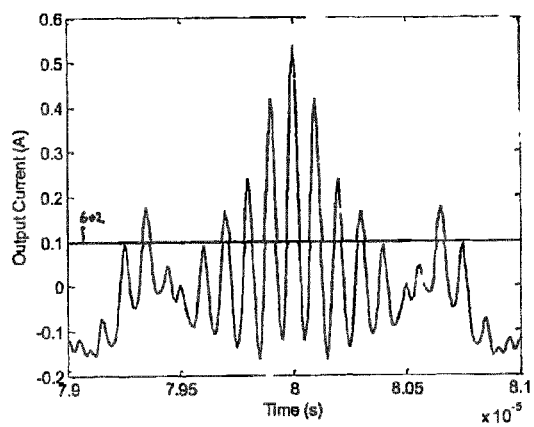
FIGS. 6(a) to 6(c) illustrate current flow in the the arrangement of FIG. 5.

The waveform of FIG. 6(a) shows the output current $I_{EA}$ of the linear amplifier 24, which is the same as that shown in FIG. 4(a). In accordance with the invention therefore, the output current $I_{EA}$ of the linear amplifier is unchanged. As illustrated in FIG. 6, the portion of the output current above the line 602 is provided by the source transistor 250. The portion of the output current below the line 602 is provided by the sink transistor 252.

Figure 6B:
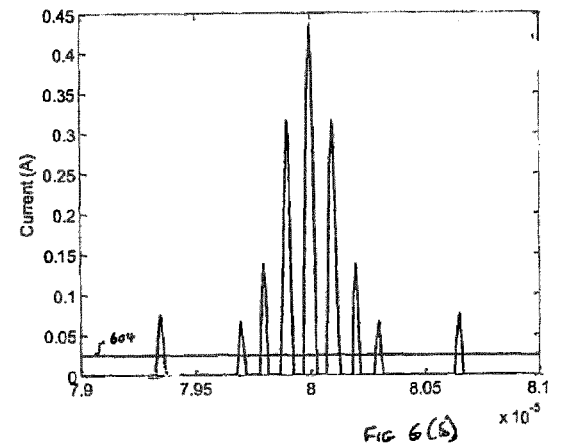
Figure 6C:
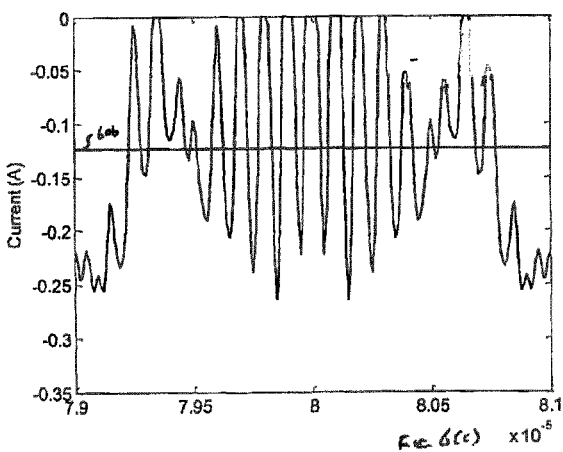

FIGS. 6(b) and 6(c) show the modified source $I_{SRC'}$ and sink $I_{SNK'}$ currents from the current source element 250 and current sink element 252 respectively. In the example shown the modified source current $I_{SRC'}$ is decreased by offset current Ios and the modified sink current is increased by offset current Ios. The lines 604 and 606 in the respective FIGS. 6(b) and 6(c) represent the modified average currents flowing in the respective source and sink transistors.

As illustrated, by comparing FIGS. 4(b) and 4(c) with FIGS. 6(b) and 6(c), the effect of the additional offset current $I_{OS}$ supplied via inductor 256 is to reduce the average source current by $I_{os}$ from $I_{SRC}$ to $I_{SRC'}$, and increase the average sink current by $I_{os}$ from $I_{SNK}$ to $I_{SNK'}$. This reduces the power dissipated in the current source 250 and increases the power dissipated in the current sink 252.

FIG. 7(a) shows the dissipation 702, 704 in the output stage source and sink current devices 250 and 252 respectively, and the total dissipation 706, as a function of the offset current $I_{OS}$ for the arrangement of FIG. 5.

It can be seen that for the particular waveform illustrated the minimum dissipation in FIG. 7(a) is approximately 20% less than the dissipation with no offset current. This difference in dissipation is strongly dependant on the waveform asymmetry and is larger for more asymmetric waveforms.

The instantaneous power dissipation in the source and sink output devices 250 and 252 cannot easily be directly measured, but the average current through the source and sink devices 250 and 252 and the average output voltage can all be readily measured. Hence it is possible to calculate the 'sensed' powers as a proxy for the dissipated powers using these average parameters.

FIG. 7(b) shows the sensed powers for the source device 710, sink device 708 and the total sensed power 712.

Inductor 250 ideally has zero DC resistance, hence the DC voltage at both terminals of the inductor 250 is the same.

Referring to FIG. 5, the sensed source power can be calculated as:

$$\mathrm{avg}(V_{SUPPLY}-V_{EA}) \times \mathrm{avg}(I_{SRC'})$$

The sensed sink power can be calculated as:

$$\mathrm{avg}(V_{EA}) \times \mathrm{avg}(I_{SNK'})$$

where:
$V_{SUPPLY}$=the supply voltage applied to the feed inductor;
$V_{EA}$=the output voltage of the stage;
$\mathrm{avg}(I_{SRC'})$=the average source current; and
$\mathrm{avg}(I_{SNK'})$=the average sink current.

Figure 7:
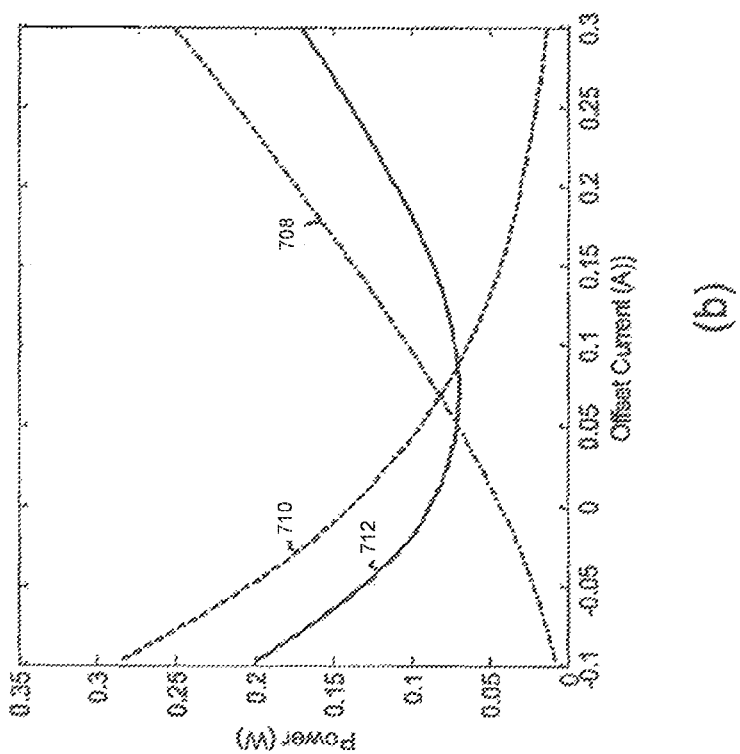
FIGS. 7(a) and 7(d) illustrate waveform plots in the arrangement of FIGS. 3 and 5.
Figure 7:
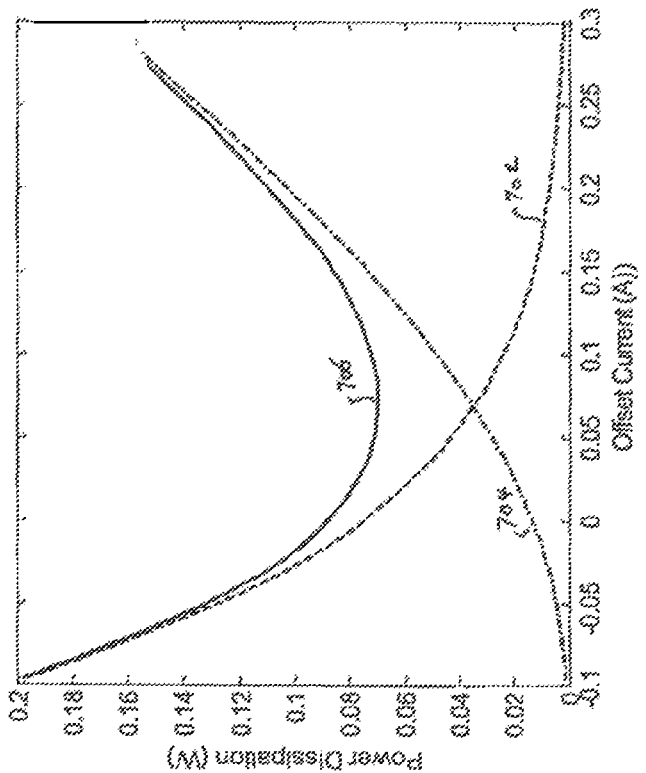

The minimum in total sensed power occurs at the same value of offset current as the minimum dissipated power, as shown in FIG. 7, hence minimising sensed power maximises the efficiency of the supply modulator.

The additional voltage supply $V_{SUPPLY2}$ in FIG. 5 is assumed to be generated using a high efficiency power converter, and the power loss in feed inductor 256 is assumed to be minimal.

Figure 8:
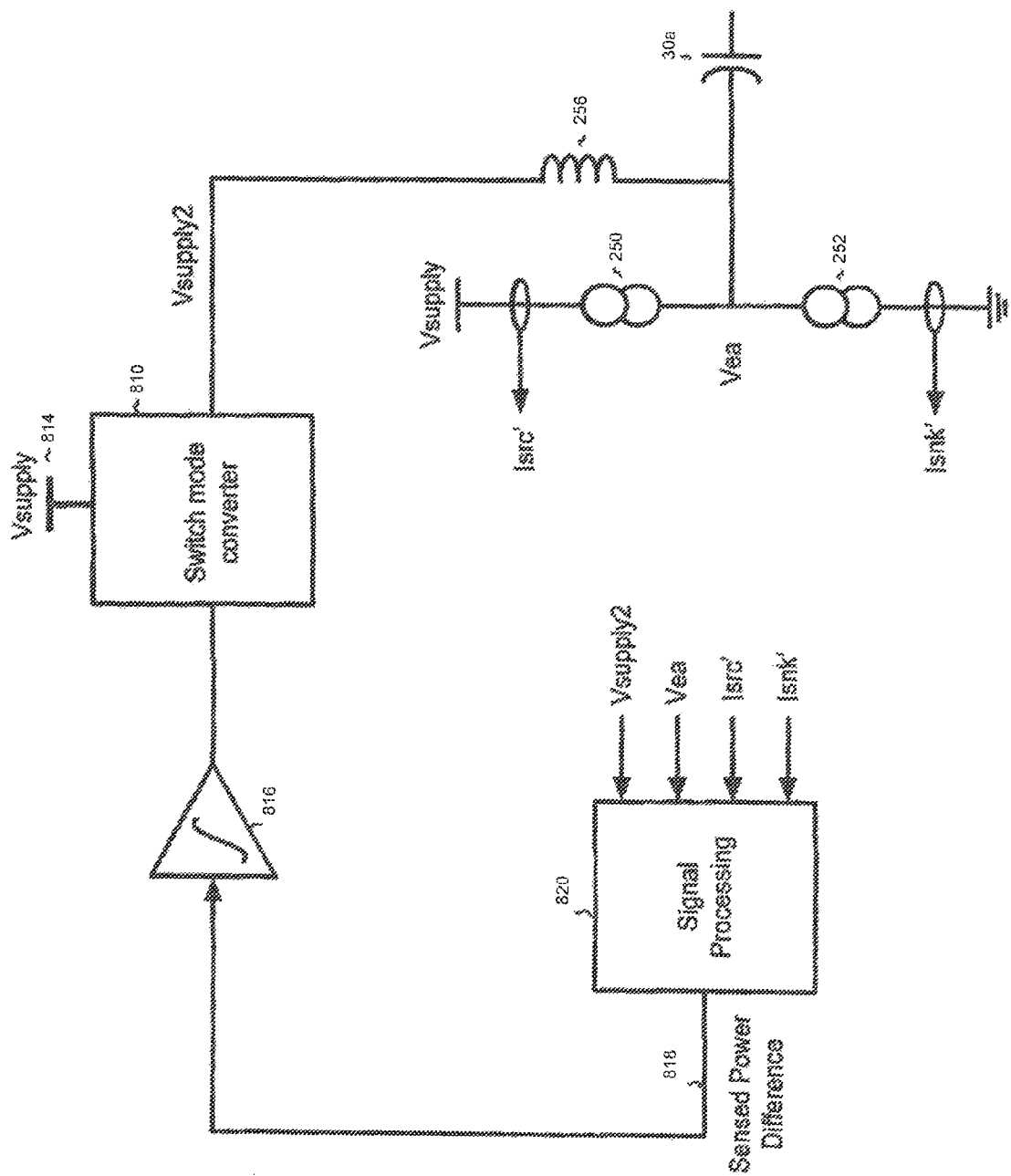
FIG. 8 illustrates the implementation of the output of a linear amplifier in the arrangement of FIG. 1 or FIG. 2 in accordance with an exemplary embodiment of the present invention.

FIG. 8 shows a direct technique for generating the offset current in which a negative feedback loop may be used to minimise the total sensed power by minimising the difference between the two sensed powers, by integrating the error to make small adjustments to the output voltage of the second supply $V_{SUPPLY2}$.

FIG. 8 shows the output stage of the error amplifier comprising current source 250, current sink 252, combining capacitor 30a and DC current offset feed inductor 256. The supply voltage $V_{SUPPLY2}$ is provided by a switch mode converter 810, which is connected to a supply voltage $V_{SUPPLY}$ denoted by reference numeral 814.

The input to the switch mode converter 810 is provided by an integrator 816. The input to the integrator 816 is provided by a signal processing block 820, which generates a signal representing the sensed power difference on line 818 to the input of the integrator 816 based on the second supply voltage Vsupply2, the average output voltage Vea, and the average of the source and sink currents $I_{SRC'}$ and $I_{SNK'}$.

An indirect method of controlling the offset current exploits the fact that the offset current required depends on the asymmetry of the waveform. If the waveform is symmetrical the mean voltage lies midway between the minimum and maximum values of the waveform. If the mean voltage is less than midway between the minimum and maximum values of the waveform a positive offset current is required to minimise the output stage power dissipation. Similarly if the mean voltage is greater than midway between the minimum and maximum values of the waveform a negative offset current is required to minimise the output stage dissipation.

Figure 9:
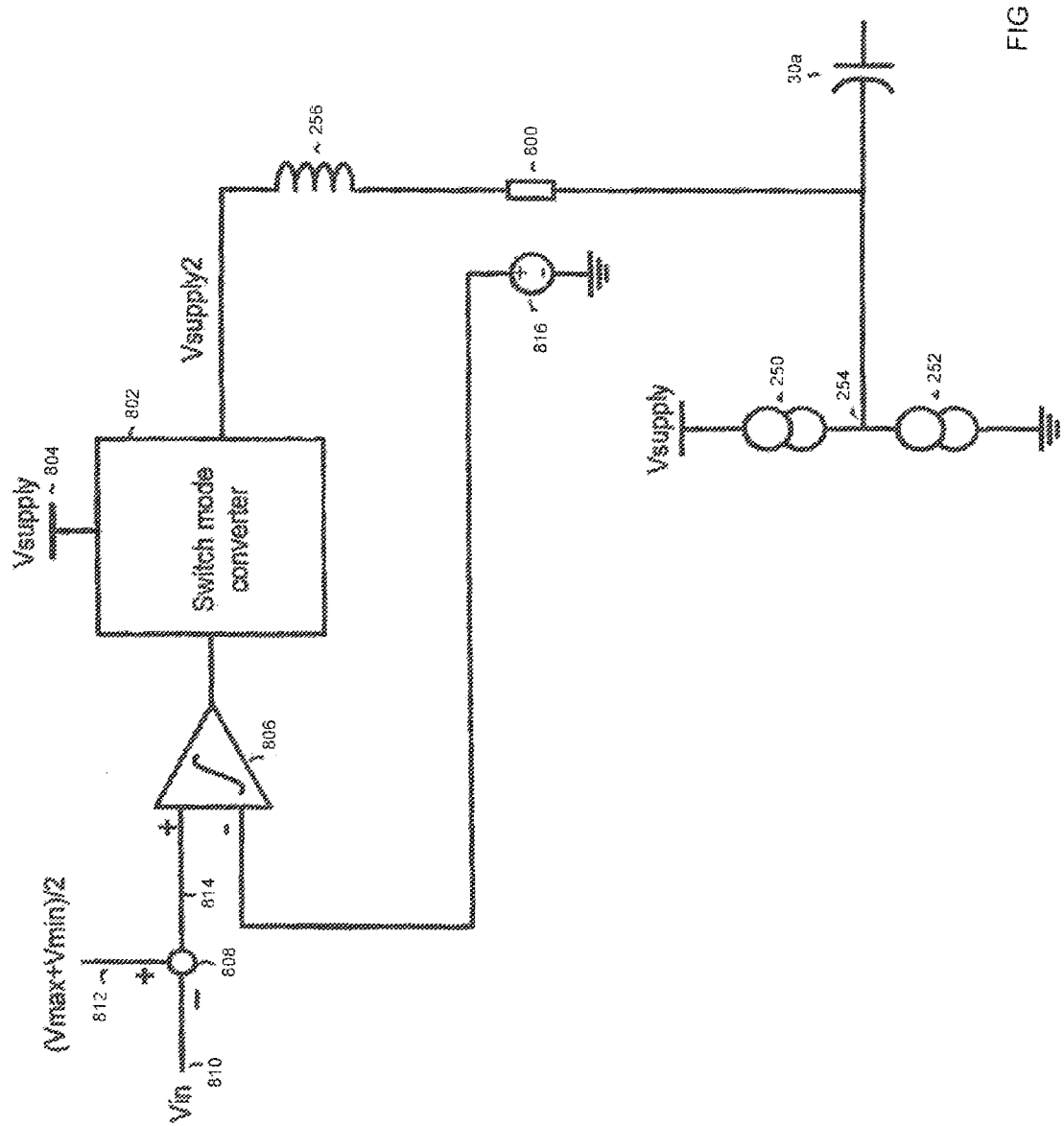
FIG. 9 illustrates the implementation of the output of a linear amplifier in the arrangement of FIG. 1 or FIG. 2 in accordance with another exemplary embodiment of the present invention.

FIG. 9 shows a control loop for implementing this indirect concept.

The control loop includes the current source 250 and current sink 252 of the output stage, the combining capacitor 30a, and the DC current offset feed inductor 256. The inductor 256 is connected to the node 254 via current sense resistor 800.

The supply voltage Vsupply2 is provided by a switch mode converter 802, which is connected to a supply voltage $V_{SUPPLY}$ denoted by reference numeral 804.

The input to the switch mode converter is provided by an integrator 806. A first input of the integrator is provided by a subtractor 808, which provides a difference between the voltage which is midway between the minimum and maximum values of the input waveform on line 812 (equal to (Vmax+Vmin)/2) and the input waveform Vin 810 to give a voltage representative of the offset current target on line 814 at the first input to the integrator 806. The second input to the integrator 806 is provided by a voltage source 816, which measures the current in the resistor 800 and provides a voltage representing the offset current.

The current offset target on line 814 is set as the difference between the mean and median waveform voltages as described above. The error between the target and measured offset current is integrated by integrator 806 and used to control the switch mode converter 802 which generates the second supply voltage $V_{SUPPLY2}$ which supplies the offset current to the linear amplifier output stage via the inductor 256.

The generation of the offset current and the second supply may be achieved in a number of ways, both indirectly and directly, and the invention is not limited to any particular technique.

Figure 1:
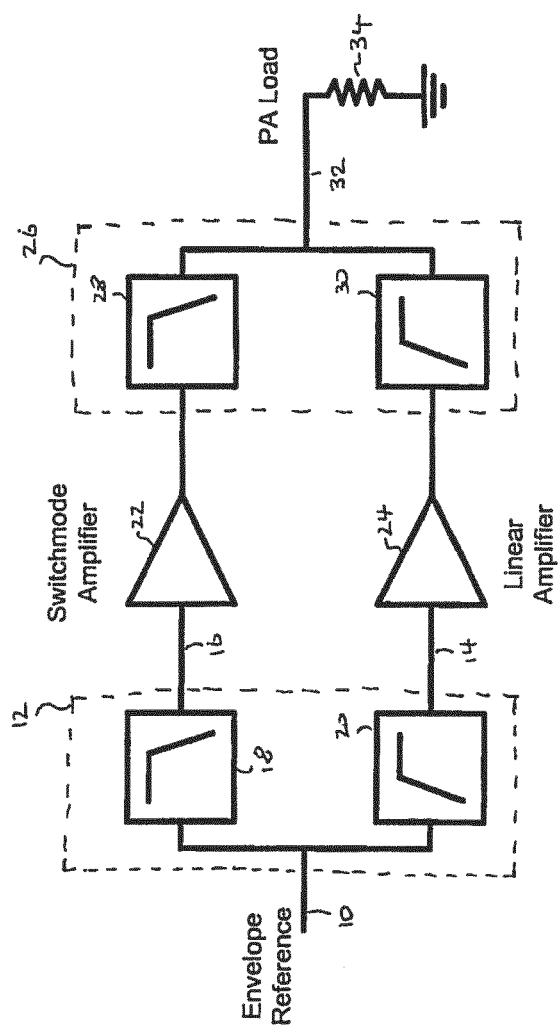
FIG. 1 illustrates a prior art envelope tracking modulated supply with high and low frequency paths.

As discussed above the present invention may be applied to the output of a linear amplifier in a correction path of a modulated power supply, such as the linear amplifier of FIG. 1 or FIG. 2.

Such modulated power supplies may be used to provide the modulated power supply to an RF amplifier, which may comprises the load of FIG. 1 or FIG. 2.

RF amplifiers are used in mobile communication systems, in wireless devices and wireless infrastructure.

The invention and its embodiments relates to the application of envelope tracking (ET) to radio frequency (RF) power amplifiers, and is applicable to a broad range of implementations including cellular handsets, wireless infrastructure, and military power amplifier applications at high frequencies to microwave frequencies.

The invention has been described herein by way of example with reference to embodiments. The invention is not limited to the described embodiments, nor to specific combinations of features in embodiments. Modifications may be made to the embodiments within the scope of the invention. The scope of the invention is defined by the appended claims.

The invention claimed is:

1. An envelope tracking power supply arranged to generate a modulated supply voltage in dependence on a reference signal, comprising:
   a first path for tracking low frequency variations in the reference signal; and
   a second path for tracking high frequency variations in the reference signal, wherein the second path comprises:
      a linear amplifier having an output stage coupled to an output node, wherein the output stage comprises a current source and a current sink, wherein the current source is coupled between the output node and a first voltage supply and the current sink is coupled between the output node and electrical ground;
      a switch mode converter configured to generate a second voltage supply to generate a DC offset current based on a power difference between a power associated with the current sink and a power associated with the current source; and
      an inductor, coupled between the second voltage supply and the output node, for providing the DC offset current at the output node.

2. The envelope tracking power supply of claim 1, wherein the DC offset current is chosen to minimize the power dissipated in the output stage of the linear amplifier.

3. The envelope tracking power supply of claim 1, wherein the DC offset current is derived from the second voltage supply having a voltage that is lower than a voltage of the first voltage supply coupled to the current source.

4. The envelope tracking power supply of claim 1, further comprising:
   a signal processing unit configured to measure a voltage of the second voltage supply for generating the DC offset current, the output voltage at the output node, a source current, and a sink current.

5. An envelope tracking power supply arranged to generate a modulated supply voltage in dependence on a reference signal, comprising:
   a first path for tracking low frequency variations in the reference signal; and
   a second path for tracking high frequency variations in the reference signal, wherein the second path comprises:
      a linear amplifier having an output stage coupled to an output node, wherein the output stage comprises a current source and a current sink, wherein the current source is coupled between the output node and a first voltage supply and the current sink is coupled between the output node and electrical ground;
      an inductor, coupled between a second voltage supply and the output node, for providing a DC offset current at the output node; and
      circuitry configured to determine a target DC offset current in dependence on a difference between an input voltage waveform and a halved sum of maximum and minimum voltage levels of the input waveform voltage.

6. The envelope tracking power supply of claim 5, further comprising:
   a switch mode converter configured to generate the second voltage supply; and
   an integrator configured to integrate an error between the target DC offset current and a measured DC offset current and to control the switch mode converter based on the integrated error.

7. An RF amplifier including an envelope tracking power supply according to claim 1.

8. A mobile device for a mobile communication system including an envelope tracking power supply according to claim 1.

9. An infrastructure element for a mobile communications system including an envelope tracking power supply according to claim 1.

10. A method for an envelope tracking power supply arranged to generate a modulated supply voltage in dependence on a reference signal, comprising:
    tracking, in a first path, low frequency variations in the reference signal;
    tracking, in a second path, high frequency variations in the reference signal, wherein the second path includes a linear amplifier coupled to an output node;
    sourcing a source current to the output node;
    sinking a sink current from the output node;
    sensing the power difference between a power associated with the source current and a power associated with the sink current; and
    providing a DC offset current at the output node via an inductor coupled between the output node and a first voltage supply based, at least in part, on the sensed power difference.

11. The method of claim 10, wherein the linear amplifier comprises an output stage for the sourcing and the sinking, wherein the DC offset current is chosen to minimize the power dissipated in the output stage of the linear amplifier.

12. The method of claim 10, wherein the DC offset current is derived from the first voltage supply having a voltage that is lower than a voltage of a second voltage supply coupled to a current source for sourcing the source current.

13. The method of claim 10, further comprising:
    integrating the sensed power difference to control a switch mode converter to generate the first voltage supply.

14. The method of claim 13, wherein sensing the power difference comprises measuring a voltage of the first voltage supply for generating the DC offset current, the output voltage at the output node, the source current, and the sink current.

15. A method for an envelope tracking power supply arranged to generate a modulated supply voltage in dependence on a reference signal, comprising:
    tracking, in a first path, low frequency variations in the reference signal;
    tracking, in a second path, high frequency variations in the reference signal, wherein the second path includes a linear amplifier coupled to an output node;
    sourcing a source current to the output node;
    sinking a sink current from the output node; and
    providing a DC offset current at the output node via an inductor coupled between the output node and a first voltage supply, wherein a target DC offset current is determined in dependence on a difference between an input voltage waveform and a halved sum of maximum and minimum voltage levels of the input waveform voltage.

16. The method of claim 15, further comprising:
    integrating an error between the target DC offset current and a measured DC offset current; and
    using the integrated error to control a switch mode converter to generate the first voltage supply to generate the DC offset current.

17. The envelope tracking power supply of claim 1, wherein the second voltage supply comprises a DC voltage supply.

18. The envelope tracking power supply of claim 1, further comprising:
   an integrator configured to integrate the power difference to control the switched mode converter.

* * * * *